(12) United States Patent
Staender et al.

(10) Patent No.: US 12,152,929 B2
(45) Date of Patent: Nov. 26, 2024

(54) GRAVIMETRIC MEASURING SYSTEM

(71) Applicant: SARTORIUS LAB INSTRUMENTS GMBH & CO. KG, Goettingen (DE)

(72) Inventors: Malte Staender, Heilbad Heiligenstadt (DE); Heyko Holst, Goettingen (DE)

(73) Assignee: SARTORIUS LAB INSTRUMENTS GMBH & CO. KG, Goettingen (DE)

( * ) Notice: Subject to any disclaimer, the term of this patent is extended or adjusted under 35 U.S.C. 154(b) by 471 days.

(21) Appl. No.: 17/395,054

(22) Filed: Aug. 5, 2021

(65) Prior Publication Data

US 2021/0364344 A1  Nov. 25, 2021

Related U.S. Application Data

(63) Continuation of application No. PCT/EP2020/052677, filed on Feb. 4, 2020.

(30) Foreign Application Priority Data

Feb. 5, 2019 (DE) .................... 10 2019 102 811.6

(51) Int. Cl.
*G01G 21/28* (2006.01)
*G01G 23/48* (2006.01)
(Continued)

(52) U.S. Cl.
CPC ............. *G01G 23/48* (2013.01); *G01G 21/28* (2013.01); *H05K 5/02* (2013.01); *H05K 7/18* (2013.01)

(58) Field of Classification Search
CPC .......... H05K 5/02; H05K 5/0034; H05K 5/03; H05K 7/1421; H05K 7/1425; H05K 7/18; G01G 21/28; G01G 21/286; G01G 23/48
See application file for complete search history.

(56) References Cited

U.S. PATENT DOCUMENTS 6,134,615 A  * 10/2000 Chari .................. H05K 7/1498
                                                        715/835
6,835,901 B2    12/2004 Luechinger
(Continued)

FOREIGN PATENT DOCUMENTS

CN         1654932 A    8/2005
CN       105705918 A    6/2016
(Continued)

OTHER PUBLICATIONS

Computer translation of WO 2013/111340 dated Jan. 1, 2013.*
(Continued)

*Primary Examiner* — Randy W Gibson
(74) *Attorney, Agent, or Firm* — Edell, Shapiro & Finnan, LLC

(57) ABSTRACT

A gravimetric measuring system (10) includes a balance (12) with a weighing chamber (22) surrounded by a weighing chamber wall (23, 24, 26, 28); an electromechanical weighing system (181) arranged in a weighing system chamber (18); an electronic control apparatus (36) for controlling the system operation; a cooling apparatus (34), controllable by the control apparatus, for cooling the weighing chamber (22); and a plurality of functional modules (14, 16) that generate heat during operation and are insertable into module receptacles (283) arranged on the weighing chamber wall (28). The module receptacles (283) have device-side thermal interface components (32a) that are thermally connected to the cooling apparatus (34), and the functional modules (14, 16) have corresponding module-side thermal interface components (32b) that, in an inserted state of the respective functional module (14, 16), thermally contact the device-side thermal interface component (32a) of the respectively associated module receptacle (283).

10 Claims, 4 Drawing Sheets

(51) Int. Cl.
*H05K 5/02* (2006.01)
*H05K 7/18* (2006.01)

(56) References Cited

U.S. PATENT DOCUMENTS

| | | | | |
|---|---|---|---|---|
| 6,951,989 | B2* | 10/2005 | Nufer | G01G 23/00 |
| | | | | 177/180 |
| 8,674,823 | B1* | 3/2014 | Contario | G01R 19/145 |
| | | | | 340/693.1 |
| 9,520,043 | B1* | 12/2016 | Alshinnawi | G06F 13/4068 |
| 10,197,435 | B2 | 2/2019 | Graf et al. | |
| 10,393,570 | B2 | 8/2019 | Esser et al. | |
| 10,642,321 | B2* | 5/2020 | Aimone | H05K 7/1498 |
| 11,002,591 | B2 | 5/2021 | Buchmann et al. | |
| 2003/0115929 | A1 | 6/2003 | Luchinger et al. | |
| 2004/0079558 | A1 | 4/2004 | Luchinger et al. | |
| 2011/0291813 | A1* | 12/2011 | Jansma | H05K 7/1498 |
| | | | | 340/10.5 |
| 2013/0264889 | A1* | 10/2013 | Quittek | H04B 3/54 |
| | | | | 324/649 |
| 2014/0015857 | A1* | 1/2014 | Smith | G06F 3/048 |
| | | | | 345/629 |
| 2014/0265794 | A1* | 9/2014 | Schroeder | A47B 88/477 |
| | | | | 267/141 |
| 2015/0113296 | A1* | 4/2015 | Slotten | G06F 1/189 |
| | | | | 713/310 |
| 2015/0311649 | A1* | 10/2015 | Horne | H01R 13/6691 |
| | | | | 439/489 |
| 2016/0250628 | A1 | 9/2016 | Graf et al. | |
| 2016/0252389 | A1* | 9/2016 | Esser | H01L 21/67 |
| | | | | 177/25.13 |
| 2021/0364341 | A1* | 11/2021 | Staender | G01G 23/48 |
| 2021/0364342 | A1* | 11/2021 | Feldotte | G01G 21/286 |
| 2021/0364343 | A1* | 11/2021 | Feldotte | G01G 21/28 |
| 2021/0385960 | A1* | 12/2021 | Horii | H05K 5/03 |

FOREIGN PATENT DOCUMENTS

| | | |
|---|---|---|
| CN | 106298705 A | 1/2017 |
| DE | 102009055624 A1 | 5/2011 |
| DE | 102009055622 B4 | 8/2014 |
| DE | 102014101558 A | 5/2015 |
| DE | 102014101561 A1 | 5/2015 |
| EP | 1195584 A1 | 4/2002 |
| EP | 1312902 A1 | 5/2003 |
| EP | 1396711 B1 | 1/2006 |
| EP | 3557199 A1 | 10/2019 |
| JP | H0228522 A | 1/1990 |
| JP | 2586115 B2 | 2/1997 |
| TW | 201343061 A | 10/2013 |

OTHER PUBLICATIONS

International Search Report, PCT/E2020/052677, May 19, 2020, 6 pages.
Chinese Search Report with English translation, Application No. 202080009304.8, Sep. 9, 2022, 8 pages.
Second Chinese Search Report with English translation, Application No. 202080009304.8, Apr. 25, 2023, 8 pages.

* cited by examiner

GRAVIMETRIC MEASURING SYSTEM

CROSS REFERENCE TO RELATED APPLICATIONS

This is a Continuation of International Application PCT/EP2020/052677, which has an international filing date of Feb. 4, 2020, and which claims the priority of German Patent Application 10 2019 102 811.6, filed Feb. 5, 2019. The disclosures of both applications are incorporated in their respective entireties into the present Continuation by reference.

FIELD OF THE INVENTION

The invention relates to a gravimetric measuring system, comprising
a balance with a weighing chamber, surrounded by a weighing chamber wall; an electromechanical weighing system; an electronic control apparatus for controlling the system operation; and a cooling apparatus, which can be controlled by the control apparatus, for cooling the weighing chamber; and
a plurality of functional modules, which generate heat during operation and which can be inserted, as necessary, into module receptacles, arranged on the weighing chamber wall.

BACKGROUND

Gravimetric measuring systems of this type are known from EP 1 195 584 A1.

Analytical and laboratory balances, in particular, those that work on the principle of electromagnetic compensation, are well known. In this case an electromechanical weighing system, for example, a DMS (strain gauge) or an EMC (electromagnetic force compensation) system, is arranged in a weighing system chamber, which is intended to ensure a shielding that is as good as possible with respect to environmental influences. A carrier, connected to the load receptacle, projects into a usually adjacent weighing chamber, which is also largely shielded from the environment, in particular, by its weighing chamber wall. The weighing chamber walls usually consist of the weighing chamber base, the weighing chamber cover, weighing chamber side walls as well as a front and rear wall. The rear wall may often coincide with a wall of the weighing system chamber. One side wall or both side walls of the weighing chamber are often designed as movable draft shield elements. The cover and/or the front side may also contain, as a rule, closable access openings. The coupling of the carrier to the load receptacle of the weighing system usually passes through the rear wall or the base of the weighing chamber.

Furthermore, such balances always contain a control apparatus, which controls, in particular, the weighing sensor system and, in so doing, specifically controls the plunger coil arrangement of the weighing system. However, the control apparatuses of modern balances can be designed to be significantly more complex and, in particular, can provide different operating routines of the system operation. Such operating routines may relate to the control of the sensor system or a cooling apparatus, but may relate, as an alternative or in addition, to the control of certain auxiliary apparatuses in or on the weighing chamber. Purely by way of example, mention may be made here of a cooling apparatus, a draft shield controller, lifting apparatuses inside the weighing chamber, lighting apparatuses and the like.

It is known from the representative document, mentioned in the introduction, to make such auxiliary apparatuses incorporating a weighing function reference available in the form of modules, i.e., as modules relating to the weighing function—in short: functional modules—and to provide a rail-like holding apparatus in the weighing chamber, in particular, on the rear wall thereof. Such holding apparatus have various mechanical interfaces, to which functional modules, required in the specific individual case, can be attached in the respectively required position. In other words, such functional modules can be inserted, as required, into corresponding module receptacles on the weighing chamber wall. Such a modular system is particularly advantageous in laboratory environments, in which different weighing tasks have to be carried out using one and the same balance. The balance can then be assembled by the user himself in accordance with his specific requirement in his particular case. Even in cases, where the mechanical interfaces are designed such that the user cannot swap modules, such modular systems are also advantageous for the manufacturer. Using the same balance base body as a starting point, it is possible to pre-assemble balances for different weighing tasks by selecting the functional modules inserted into the module receptacles. The number of special parts to be produced is drastically reduced, an aspect that leads to a significant cost cutting.

The problem with the concept, described above, is the fact that in the case of active modules, such as, for example, a lighting system, a motor driven module, an ionizer or the like, a different heat output is introduced by different modules. However, weighing operations are known to be extremely temperature critical. Typically, the object is to adapt the temperature of the entire weighing chamber exactly to the ambient temperature. However, concepts also exist in which the object is to build up a specific temperature gradient in the weighing chamber. One example that can be mentioned in this respect is the German patent document DE 10 2009 055 622 B4. In any case the temperature distribution, which is achieved in the known apparatus, is always the result of a highly accurate matching, both spatially and with respect to the thermal output, of the installed heat sources and compensating cooling measures. Any change in the specific arrangement of the heat sources, such as that change that is automatically produced when the weighing chamber is configured with different functional modules such that the configuration matches, as required, the changing requirements, will have a disruptive effect on the temperature distribution in the weighing chamber and, therefore, an adverse effect on the weighing accuracy.

The post-published European patent document EP 3 557 199 A1 discloses a balance with a weighing chamber rear wall, which can be assembled from a plurality of wall elements, the height of this rear wall being adaptable in this manner to different draft shield heights; such that weighing chambers of different heights can be constructed.

The European patent document EP 1 312 902 A1 discloses a balance, on the weighing chamber rear wall of which an electronic auxiliary unit, in which supply units, for example, a battery, or even an electronic control unit, can be arranged so that a functional module, as defined herein, can be attached. The document does not make any reference at all to the associated problem of heat input into the weighing chamber.

The European patent document EP 1 396 711 B1 discloses a balance with a weighing chamber, which is not equipped with any functional modules; and said balance removes the heat from the weighing electronics out of the weighing chamber via a thermoelectric element, where in this case the special thermal coupling to the weighing chamber rear wall ensures the formation of a temperature gradient inside the weighing chamber.

The German patent document DE 10 2014 101 561 A1 discloses a gravimetric dosing apparatus with a climate measuring module arranged in the weighing chamber. Based on the climate data determined with said climate measuring module, the components, which are to be mixed in accordance with the dosing process, can be temperature-controlled beforehand outside the apparatus.

The German patent document DE 10 2009 055 624 A1 discloses a balance with weighing electronics, which are arranged in a housing substructure and which are shielded against, in particular, the weighing chamber with a thermal shielding plate, with the shielding plate being connected to the cooling side of a thermoelectric module.

A similar approach is used in the Japanese patent document JP 2 586 115 B2, where in this case the thermally shielded weighing electronics are located in a housing behind the weighing chamber.

SUMMARY

An object of the present invention is to further develop a gravimetric measuring system of the generic type such that the weighing chamber is configured with functional modules such that, when the configuration is changed, as necessary, the temperature distribution in the weighing chamber will not be disrupted due to said change; or at a minimum said disruption of the temperature distribution will be significantly reduced.

This object is achieved by gravimetric measuring systems distinguishing over known systems in that the module receptacles have device-side thermal interface components, which are thermally connected to the cooling apparatus, and the functional modules have corresponding, module-side thermal interface components, which in the inserted state of the respective functional module thermally contact the device-side thermal interface component of the respectively associated module receptacle.

Preferred embodiments are the subject matter of the dependent claims.

The invention provides an automatic connection of the functional modules, i.e., the changing heat sources, to a central cooling apparatus of the balance. All of the module receptacles, i.e., all of the positions, at which active, i.e., heat-generating functional modules can be installed, are equipped with device-side thermal interface components, which, however, are only used, as necessary, i.e., if a functional module with corresponding, module-side thermal interface components is actually installed. In cases, where no functional module is installed in a given module receptacle, the device-side thermal interface component has no partner; that means that it is not contacted. Such a module receptacle, which is not occupied by an active functional module, can be closed with a panel or a passive (i.e., non-heat-generating) functional module. In this case such a panel or such a passive functional module can be equipped optionally with suitable thermal insulation (schematically represented with reference symbol $I_n$ in FIG. 3) so that the uncontacted device-side thermal interface component does not represent a cold source that interferes with the temperature distribution in the weighing chamber. As an alternative, it can be provided that the overall thermal design of the balance is carried out so as to take into account such cold sources. That means that the desired temperature distribution in the weighing chamber occurs, in particular, in the case of uncontacted device-side thermal interface components, thus, without installed active functional modules.

When an active functional module is installed, the mutual thermal interface components are automatically contacted, so that the cooling apparatus can dissipate the heat, generated in the functional module, in a compensating manner. Such a thermal interface can be implemented, for example, in the form of two, preferably mutually spring-loaded metal plates (shown simply in schematic form in FIG. 5), of which one is thermally coupled to the cooling apparatus; and the other is thermally connected to the heat source of the functional module. These plates are positioned relative to one another on the balance, in particular, in the region of the module receptacle, or on the functional module in such a way that they come into contact with one another, preferably in a spring loaded manner, when the functional module is inserted into the module receptacle.

In practical terms it is particularly advantageous if the module receptacles are standardized such that each module receptacle has the capability, in principle, for the installation of each functional module. As a result, the flexibility during assembly of the gravimetric measurement system is maximized. However, the fact that different active functional modules produce different heat outputs can be problematic. In principle, however, this problem could be counteracted with individual cooling apparatuses for each module receptacle. However, such a measure requires a very complex assembly of the cooling apparatus in terms of structure and control. It is more advantageous if all of the device-side thermal interface components are thermally connected together to the cooling apparatus, i.e. also thermally connected to one another. However, such an arrangement results in all of the device-side thermal interface components abutting the same cooling capacity, which under certain circumstances does not correspond to the heat output of the respectively installed functional module in an optimal way. Correspondingly, it could lead to the heat outputs of certain functional modules being overcompensated and that of other functional modules being undercompensated. Although this approach still provides a significant improvement over known gravimetric measurement systems of the prior art, individual compensation would be desirable, nevertheless.

For this purpose it is provided in a further development of the invention that each device-side thermal interface component has a device-side contacting area; and the device-side contacting areas are identical to one another with respect to size, and that each module-side thermal interface component has a module-side contacting area; and the module-side contacting areas vary in size depending on the specific module. In this case it can be provided, in particular, that the size of each module-side contacting area is equal to or smaller than the size of the device-side contacting areas and is dependent on the average operating heat output of the respective functional module. In other words, in this further development, therefore, a maximum standard size of the device-side contacting areas is provided, whereas the module-side thermal interface components are generally smaller and in any case adapted to the heat output of their functional modules. As a result, of the total cooling capacity of the cooling apparatus that is applied in a uniformly distributed manner to the device-side thermal interface components on account of the common coupling and the identical design of the device-side contacting areas, each functional module taps off only such a fraction that corresponds to that fraction of the total heat output that is produced by the respective module. Thus, modules with a higher heat output experience greater cooling; modules with a lower heat output experience weaker cooling. It should be noted that the contacting areas need not necessarily each be designed as continuous areas. Also feasible is an embodiment as a plurality of individual areas, in particular, individual areas of identical sizes, of which a suitable plurality is thermally contacted or not contacted, depending on the heat output of the module.

Therefore, the aforementioned further development ensures a relatively balanced cooling of the different functional modules that are installed. However, it still does not necessarily guarantee an absolute, exact compensation for the heat output generated in each functional module. However, such a compensation is achieved if the total cooling capacity applied to the device-side thermal interface components, corresponds absolutely to the total heat output, generated by the installed functional modules. Therefore, this is also provided in a further development of the invention in this way. In particular, it is provided that the control apparatus is programmed to control the cooling apparatus with a cooling capacity that is dependent on the type and number of the inserted functional modules. This assumes, as will be apparent to the person skilled in the art, that the control apparatus knows about the installed functional modules. As already mentioned above, this aspect can be ensured by suitable identification interfaces that can be implemented mechanically, electrically, electronically, optically, magnetically, or by radio transmission technology or in another way. At the manufacturer the heat outputs, generated by the individual functional modules, are known to a very high degree of accuracy. The control apparatus can be programmed accordingly to increase the cooling capacity for each additionally installed functional module by an amount corresponding to its heat output. Thus, with this measure it is ensured that the total cooling capacity applied to the device-side thermal interface components, corresponds to the total heat output produced by the installed functional modules.

Furthermore, it is preferably provided that the sizes of the module-side contacting areas are matched with one another such that each functional module taps off the amount of cooling capacity, which will compensate for its average operating heat output, from the cooling capacity, which is uniformly distributed to all of the device-side thermal interface components. This feature can be achieved, in particular, in that the sizes of the module-side contacting areas are linearly dependent on the average operating heat output of the respective functional module. For example, the module-side contacting area of a functional module, which generates twice the heat output of a reference module, can be twice as large as the module-side contacting area of the reference module.

Other features and advantages of the invention will become apparent from the following specific description and the drawings.

DETAILED DESCRIPTION

Figure 1:
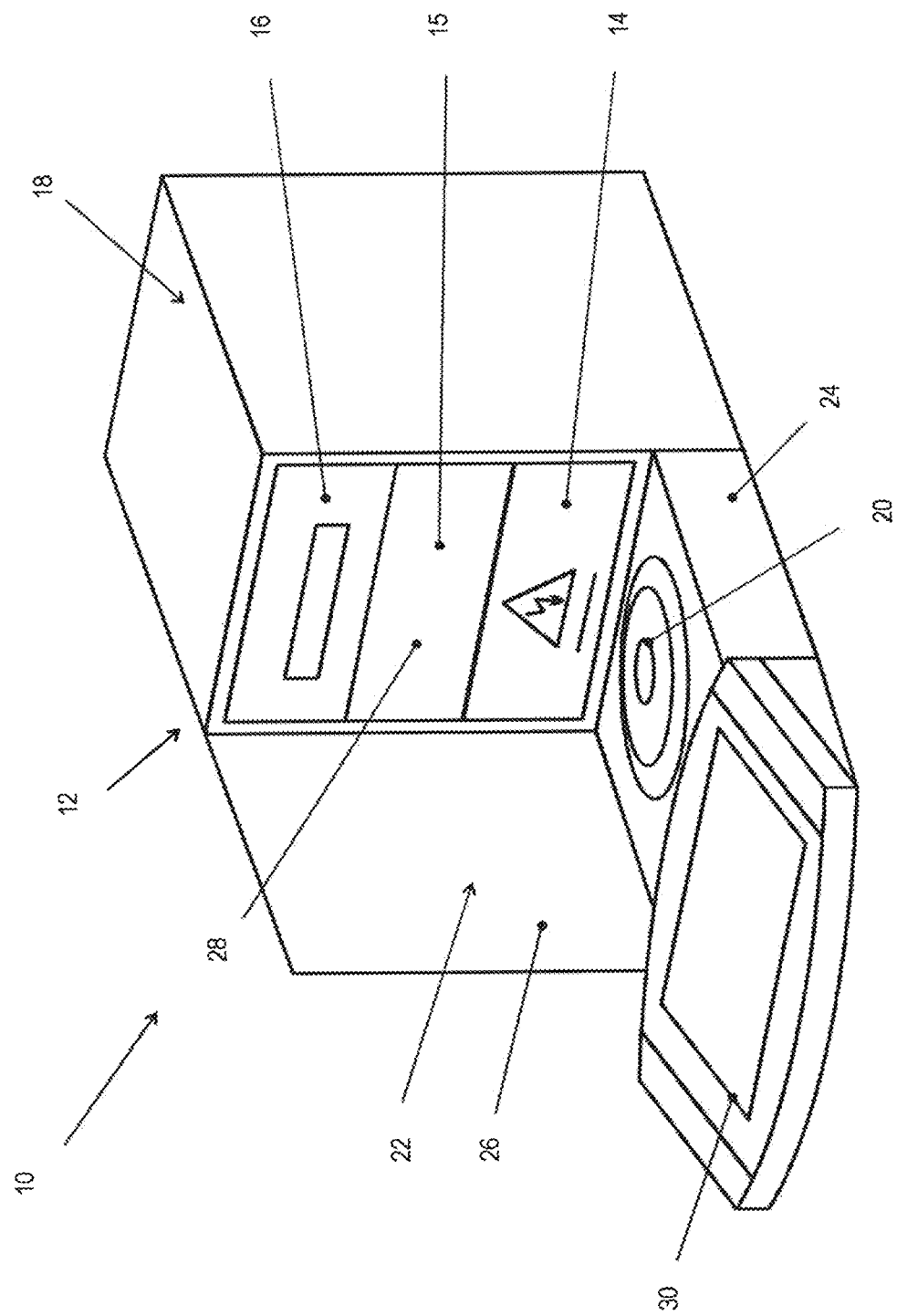
FIG. 1: is a schematic representation of a gravimetric measuring system according to the invention in the final state of assembly with an incompletely illustrated weighing chamber wall.

Identical reference numerals and symbols in the figures indicate the same or analogous elements.

FIG. 1 shows a schematic representation of a gravimetric measuring system 10 according to the invention, which consists substantially of a balance 12 and two functional modules 14, 16, inserted therein, as well as a panel 15. In the embodiment shown, the functional module, provided with the reference numeral 14, is a laser scanner unit, which is suitable for detecting bar codes; and the functional module, provided with the reference numeral 16, is a lighting unit. However, the specific functions of the functional modules 14, 16 play no role in the context of the present invention.

Figure 3:
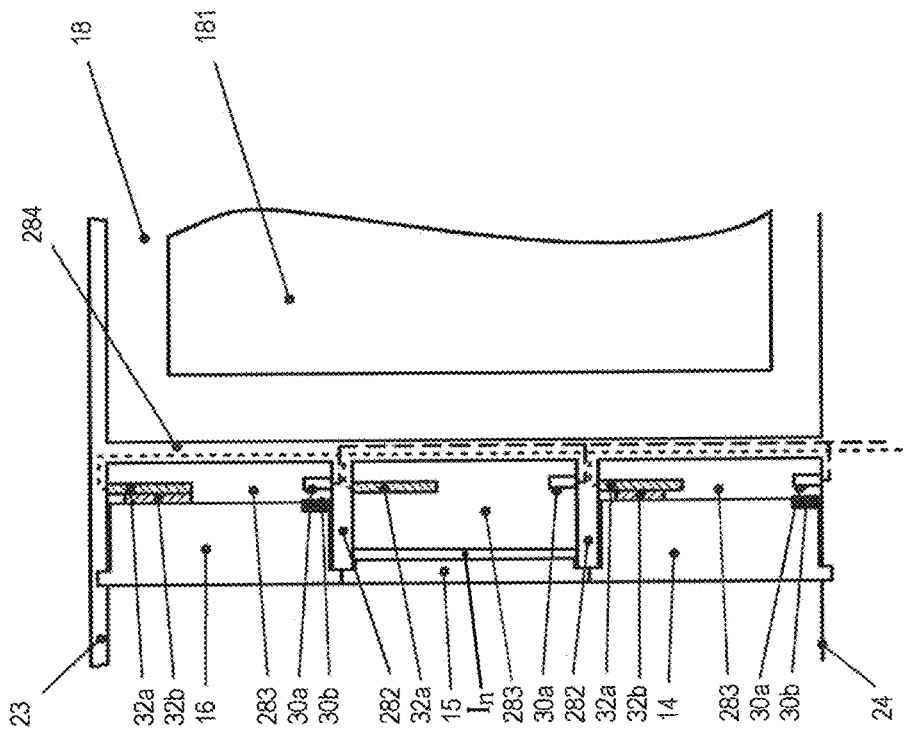
FIG. 3: is an incomplete sectional view of the weighing chamber rear wall of the balance of the gravimetric measuring system from FIG. 1 and adjacent areas.

In the embodiment shown, the balance 12 substantially comprises three regions, namely a weighing system chamber 18, in which a weighing system 181, indicated in FIG. 3, is arranged. The specific construction of the weighing system 181 does not play a role in the context of the present invention. In each case the weighing system 181 comprises a load receptacle (not shown separately), which is connected to a sample carrier 20, which in turn is arranged in a weighing chamber 22, adjoining the weighing system chamber 18 in the embodiment shown. The weighing chamber 22 is surrounded by a weighing chamber wall, which is shown only incompletely in FIG. 1. In particular, the weighing chamber base 24, through which the sample carrier 20 extends, a weighing chamber side wall 26 and a weighing chamber rear wall 28, all of which will be described in greater detail below, are illustrated. In the representation in FIG. 1, the weighing chamber rear wall 28 is covered substantially by the front sides of the functional modules 14, 16 and the panel 15, which is arranged between these functional modules 14, 16. Typically the weighing chamber walls also comprise an additional weighing chamber side wall, a weighing chamber front wall and a weighing chamber cover 23 (indicated only in FIGS. 2 and 3), but none of these are shown in FIG. 1 for reasons of better clarity.

Furthermore, the balance 12 comprises an electronic unit 30, which in the case of the embodiment shown comprises essentially a large format display. The electronic unit 30 can additionally contain a control apparatus, which will be explained in more detail below. However, this control apparatus can also be arranged at another location of the balance 12. It is considered to be advantageous if this control unit is arranged so as to be thermally insulated from the weighing system chamber 18 and from the weighing chamber 22.

Figure 2:
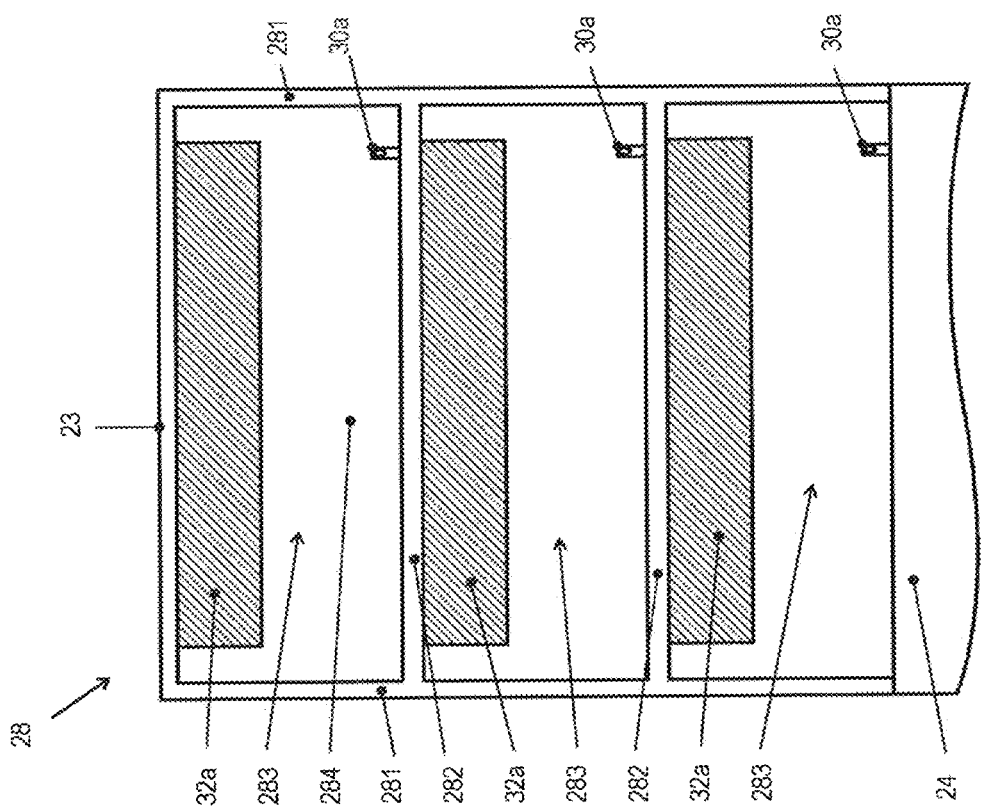
FIG. 2: is the weighing chamber rear wall of the balance of the gravimetric measuring system from FIG. 1 in an intermediate state of assembly without inserted functional modules or panels.

FIG. 2 shows a frontal view of the weighing chamber rear wall 28, but without the inserted functional modules 14, 16 and without the panel 15. FIG. 3 shows a sectional view of the weighing chamber rear wall 28 and adjoining regions of the balance 12, although the illustration of FIG. 3 also shows the inserted functional modules 14, 16 and the inserted panel 15. Despite this difference an integrated view of FIGS. 2 and 3 makes it easier to understand the following description.

The weighing chamber rear wall 28 is constructed of vertical posts 281 and struts 282, arranged transversely thereto. Between these, there extend recesses 283, which are also referred to herein as module receptacles 283. On the weighing system chamber side, the weighing chamber rear wall 28 has an end wall 284, which seals the weighing system chamber 18 and which prevents access through the module receptacles 283 into the weighing system chamber 18. In the illustrated embodiment the end wall 284 is at the same time the front wall of the weighing system chamber 18.

The module receptacles 283 serve to house in a spatially adapted manner the functional modules 14, 16. The embodiment according to FIGS. 1 and 3 has no functional module is inserted into the central module receptacle 283 in FIGS. 2 and 3. Instead, this recess 283 between the posts 281 and struts 282 is closed off with the panel 15 towards the weighing chamber. The module receptacles 283 are designed identically with respect to their configuration, as will be described in greater detail below, so that the functional modules 14, 16 can be inserted just like other, compatibly designed functional modules into each of the module receptacles 283. With regard to their size the module receptacles 283 are designed preferably identically, in particular so that they merge into each other, and preferably without a separating element. This permits the functional modules 14, 16, the size of which corresponds to an integer multiple of a unit size, can be inserted so as to fit exactly into one or more adjacent module receptacles 283. It is also feasible that the sizes of the module receptacles 283 themselves are different integer multiples of a unit size. The same applies to the panels 15 as to the functional modules 14, 16.

Each module receptacle 283 has a device-side identification interface component 30*a*, which can interact with a corresponding module-side identification interface component 30*b* of an inserted functional module 14, 16, in order to identify the inserted functional module 14, 16 and to connect it to a control unit through a corresponding data line (dashed lines).

Furthermore, each module receptacle 283 has a device-side thermal interface component 32*a*, which is in thermal contact with a corresponding module-side thermal interface component 32*b* of an inserted functional module 14, 16. The device-side thermal interface components 32*a* are thermally connected (dotted lines) to one another and to a cooling apparatus 34, as depicted in FIG. 4.

Although additional interfaces, such as, for example, electrical and electronic, in particular, data interfaces, for controlling the functional modules 14, 16 are preferably provided, they are not shown in the figures for the sake of clarity.

A special feature of the module-side thermal interface components 32*b* of the illustrated embodiment lies in the fact that in comparison to the device-side thermal interface components 32*a* and to one another, they have different contacting area sizes. All of the module-side thermal interface components 32*b* are smaller than or at most just as large as the device-side thermal interface components 32*a* that are identical to one another with respect to size. The specific size of the module-side contacting areas depends on the heat output of the respective functional modules 14, 16. In particular, there can be a proportionality between the heat output and the size of the thermal contact area of the modules.

Figure 4:
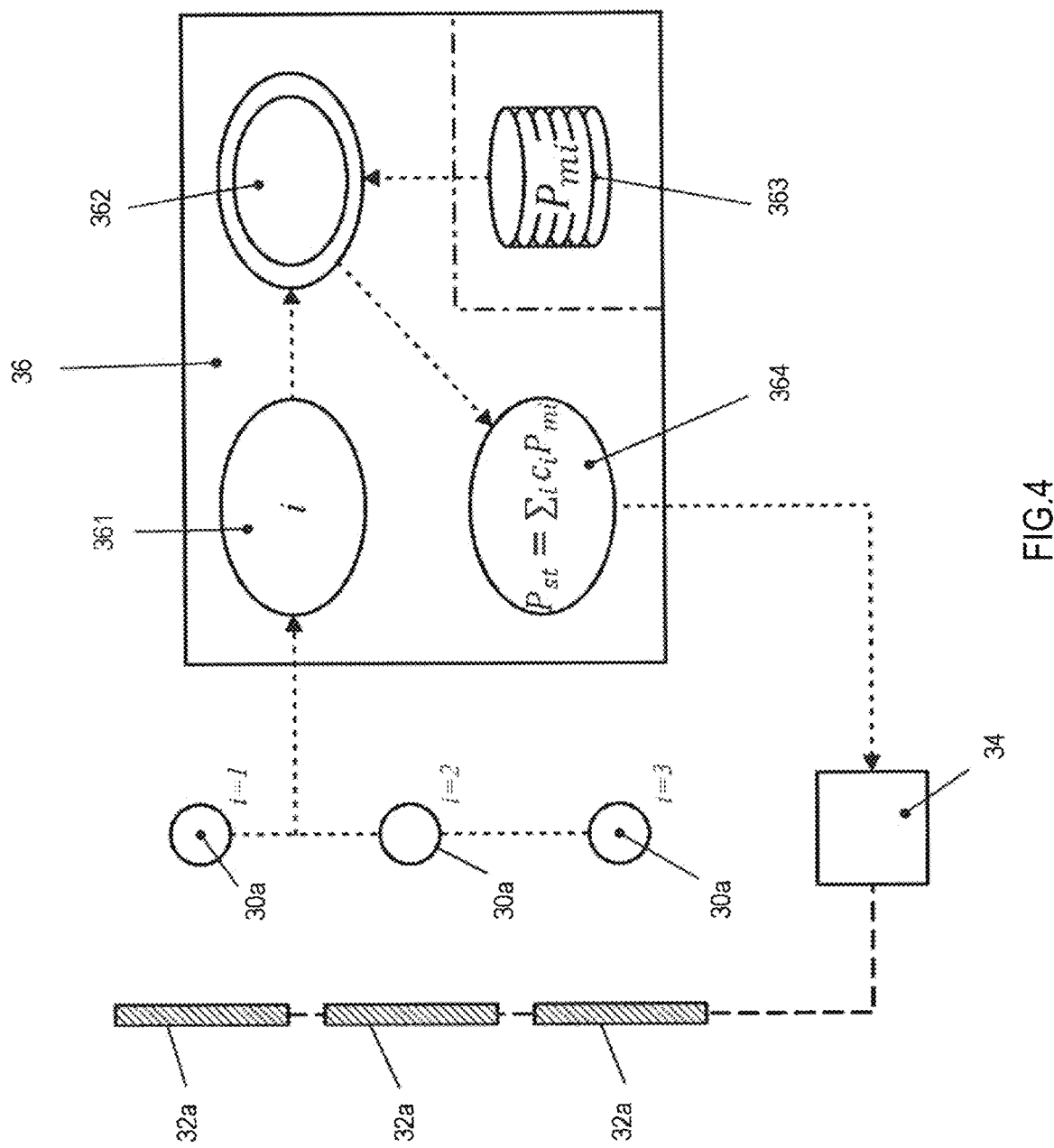
FIG. 4: is a schematic representation of a preferred cooling control of the balance of the gravimetric measuring system from FIG. 1.
Figure 5:
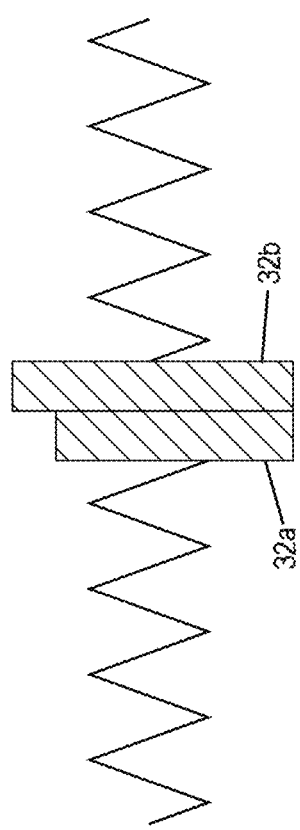
FIG. 5: is a simple schematic representation of the spring-loaded metal plates from FIG. 3.

FIG. 4 shows a preferred embodiment of a control of the balance 12. Shown are the device-side thermal interface components 32*a*, which are thermally connected to one another and to a cooling apparatus 34, and the device-side identification interface components 30*a*, which are identified here in each case with the index i. The identification data, obtained through interaction between the device-side and module-side identification interface components 30*a*, *b*, are transmitted to a control apparatus 36, and there, in particular, to the identification unit 361. In the embodiment shown in FIGS. 1 and 3, the identification interface i=1 would provide the information about the inserted lighting module 16. The identification interface i=2 would provide the information about the absence of an inserted functional module; and the identification interface i=3 would provide the information about the inserted laser scanner module 14. The identification can be carried out in a manner specific to the type of module or even in a manner specific to the individual module. The identification data are sent from the identification unit 361 to a central unit 362. The latter receives information about the specific heat outputs of the identified functional modules 14, 16 from a memory unit 363. As indicated by the dotted and dashed line, the memory unit 363 can be integrated in the control apparatus 36 or can be made available remote therefrom, for example, in a server, connected through the Internet. However, this information can also be stored in a memory unit of the functional module itself. In particular, it can be provided that after the functional module has been produced, said functional module is run through an individual measurement of its heat output at the factory in the context of the quality control, the result of which measurement is then stored in the memory unit. A type specific storage without individual measurement is also possible. In any case the storage of the information in the module itself combines the advantages of reducing the load on the balance control unit, the independence of external data sources and the possibility of customization.

From the identification data, on the one hand, and the heat output data, on the other hand, the central unit 362 calculates the default values for controlling the cooling apparatus 34; and then said default values are passed on to a cooling control unit 364, connected to the cooling apparatus. In the illustrated embodiment the predetermined cooling capacity $P_{st}$ corresponds to a static cooling capacity, which is derived from the sum of the individual heat outputs $P_{mi}$ of the identified functional modules 14, 16, in each case multiplied by a weighting factor $c_i$: $P_{st} = \Sigma_i c_i P_{mi}$. In this case the total cooling capacity P is obtained as a sum of a module-independent basic cooling capacity $P_0$ (not mentioned in FIG. 4) and the module-dependent static cooling capacity $P_{st}$: $P = P_0 + P_{st} + P_v$.

The weighting factor $c_i$ can be used, for example, to take into account the specific position, i.e., the specific module receptacle, in which a functional module 14, 16 is inserted. Such a weighting can also be dispensed with; in other words, the weighting factor corresponds then to 1 and/or is identical in all summands.

This static cooling capacity $P_{st}$ is uniformly distributed from the cooling apparatus 34 to all of the device-side thermal interface components 32*a*. The respective, requirement specific distribution to the functional modules 14, 16 takes place as a result of the different sizes of the module-side thermal interface components 32*b*.

In a further development of this cooling control, the static cooling capacity $P_{st}$ forms only one of a plurality of terms of the total cooling capacity P: $P = P_0 + P_{st} + P_v$, where $P_v = P_v(T)$. In this embodiment, in addition to the static cooling capacity $P_{st}$, there is also provided a small, regulated cooling capacity contribution, the cooling capacity correction $P_v$, with which it is possible to compensate for small fluctuations of the temperature T in the weighing chamber 22.

The embodiments, discussed in the specific description and shown in the figures, represent only illustrative exemplary embodiments of the present invention. In light of the disclosure herein, the person skilled in the art is given a broad spectrum of possible variations. In particular, it is possible, as an alternative or in addition to the weighing chamber rear wall 28, to design one or more of the remaining walls of the weighing chamber wall in the manner described as a post/strut structure with recesses, designed as module receptacles. In such cases, in which the module receptacles do not adjoin a chamber to be sealed, in particular, for reasons of calibration, a special sealing wall, as in the embodiment shown here, is not necessary.

LIST OF REFERENCE NUMERALS AND SYMBOLS

10 Gravimetric measurement system
12 Balance
14 Functional module
15 Panel
16 Functional module
18 Weighing system chamber
181 Weighing system
20 Sample carrier
22 Weighing chamber
23 Weighing chamber cover
24 Weighing chamber base
26 Weighing chamber side wall
28 Weighing chamber rear wall
281 Post
282 Strut
283 Recess/module receptacle
284 End wall
30a/b Device-side/module-side identification interface component
32a/b Device-side/module-side thermal interface component
34 Cooling apparatus
36 Control apparatus
361 Identification unit
362 Central unit
363 Memory unit
364 Cooling control unit
P Total cooling capacity
$P_0$ Basic cooling capacity
$P_v$ Cooling capacity correction
$c_i$ Weighting factor
$P_{mi}$ Module-specific heat output
T Temperature (in the weighing chamber)
$I_n$ Insulation

What is claimed is:

1. A gravimetric measuring system, comprising
a balance with a weighing chamber comprising a weighing chamber wall that includes a plurality of recesses defining module receptacles arranged on the weighing chamber wall;
an electromechanical weighing system;
an electronic control apparatus for controlling operation of the weighting system;
a cooling apparatus, which is controllable by the control apparatus, for cooling the weighing chamber; and
a plurality of functional modules, which generate heat during operation and which are configured for insertion into the recesses defining the module receptacles, arranged on the weighing chamber wall;
wherein the module receptacles have device-side thermal interface components, which are thermally connected to the cooling apparatus, and the functional modules have corresponding module-side thermal interface components, which in an inserted state of the respective functional module, thermally contact the device-side thermal interface component of a respectively associated one of the module receptacles to provide a connection of the respective functional module to the cooling apparatus such that the cooling apparatus dissipates heat corresponding to heat generated in the respective functional module.

2. The gravimetric measuring system as claimed in claim 1, wherein:
each device-side thermal interface component has a device-side contacting area and the respective device-side contacting areas are identical to one another with respect to size,
each module-side thermal interface component has a module-side contacting area and the respective module-side contacting areas vary in size between respective ones of the functional modules, and
the size of each module-side contacting area is equal to or smaller than the size of the device-side contacting areas and is dependent on an average operating heat output of the respective functional modules.

3. The gravimetric measuring system as claimed in claim 2, wherein the control apparatus is programmed to control the cooling apparatus with a total cooling capacity (P) that is dependent on a type and number of the inserted functional modules.

4. The gravimetric measuring system as claimed in claim 3, wherein the sizes of the module-side contacting areas are matched with one another such that each functional module taps off an amount of cooling capacity set to compensate for an average operating heat output for the functional modules from the total cooling capacity (P), which is uniformly distributed to all of the device-side thermal interface components.

5. The gravimetric measuring system as claimed in claim 4, wherein the sizes of the module-side contacting areas are linearly dependent on the average operating heat output of the respective functional modules.

6. The gravimetric measuring system as claimed in claim 2, wherein each module receptacle has a device-side identification interface component and each functional module has a corresponding module-side identification interface component, and
wherein the control apparatus is programmed to identify each functional module inserted into a respective one of the module receptacles through interaction between the respective device-side and module-side identification interface components and to control the cooling apparatus accordingly.

7. The gravimetric measuring system as claimed in claim 1, wherein the device-side thermal interface components and the module-side thermal interface components are mutually spring-loaded metal plates, and
wherein one of the spring-loaded metal plates is thermally coupled to the cooling apparatus and another of the spring-loaded metal plates is thermally connected to the heat source of the functional module.

8. The gravimetric measuring system as claimed in claim 7, wherein the spring-loaded metal plates form a spring-loaded connection when the functional module is inserted into the module receptacle.

9. The gravimetric measuring system as claimed in claim 3, wherein the control apparatus increases cooling capacity for each additionally inserted functional module by a cooling amount corresponding to a heat amount for the respective additionally inserted function module.

10. The gravimetric measuring system as claimed in claim 1, wherein module receptacles which are not occupied by functional modules are closable by a panel equipped with thermal insulation such that an uncontacted device-side thermal interface component does not represent a cold source that interferes with temperature distribution in the weighing chamber.

\* \* \* \* \*